(12) United States Patent
Kim

(10) Patent No.: US 6,656,841 B1
(45) Date of Patent: Dec. 2, 2003

(54) METHOD OF FORMING MULTI LAYER CONDUCTIVE LINE IN SEMICONDUCTOR DEVICE

(75) Inventor: Dong Joon Kim, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/315,126

(22) Filed: Dec. 10, 2002

(30) Foreign Application Priority Data

Jul. 2, 2002 (KR) .................................. 2002-0037882

(51) Int. Cl.[7] .............................................. H01L 21/44

(52) U.S. Cl. .................. 438/687; 438/622; 438/626; 438/627; 438/631; 438/637; 438/641

(58) Field of Search .................. 438/622, 626, 438/627, 631, 637, 638, 641, 643, 645, 648, 678, 687

(56) References Cited

U.S. PATENT DOCUMENTS

| | | | |
|---|---|---|---|
| 6,436,302 B1 | 8/2002 | Li et al. | |
| 6,465,345 B1 | 10/2002 | Nogami et al. | |
| 2001/0016418 A1 | * 8/2001 | Kim | ............................ 438/678 |

* cited by examiner

*Primary Examiner*—Jack Chen
(74) *Attorney, Agent, or Firm*—Morgan, Lewis & Bockius LLP

(57) ABSTRACT

The present invention relates to a method of forming a multi-layer conductive line in a semiconductor device. A portion of a contact of a lower conductive line is selectively etched by a given thickness. A sacrificial barrier layer is then formed on the etched portion of the lower conductive line. With this structure, oxidization of the lower conductive line or diffusion of the lower conductive line material can be prevented in a subsequent insulating film process. Also, sidewall diffusion of a lower conductive line generating in a process of cleaning a contact region is prevented by the sacrificial barrier layer. Therefore, the leakage current occurring between upper and lower conductive lines can be reduced.

8 Claims, 5 Drawing Sheets

METHOD OF FORMING MULTI LAYER CONDUCTIVE LINE IN SEMICONDUCTOR DEVICE

BACKGROUND OF THE INVENTION

1. Field of the Invention

The invention relates generally to a method of forming a multi-layer conductive line in a semiconductor device, and more particularly to, a method of forming a multi-layer conductive line capable of improving the reliability of the semiconductor device by preventing contamination problem due to Cu impurities and conductive line to conductive line leakage due to Cu re-deposition within a dual damascene pattern.

2. Description of the Prior Art

Generally, in semiconductor devices, electron devices, or the like, the technology in which a conductive film such as aluminum (Al), tungsten (W), or the like is deposited on an insulating film and the conductive film is then patterned by common photolithography process and dry etching process to form a conductive line, has been widely used as the technology for forming the conductive line. In particular, as an effort to reduce a RC delay time in logic devices of the semiconductor device that requires a high speed, a research on the use of a metal such as copper (Cu) having a low resistivity as the conductive line instead of aluminum (Al) or tungsten (W) has recently been made.

In the process of forming the conductive line using copper (Cu), however, as the patterning process of Cu: is difficult compared to those of Al or W, a process by which a trench is formed and the trench is then buried to form the conductive line, so called 'a damascene process' has been used. The damascene process can be classified into a single damascene process by which a via hole is formed, the via hole is filled with a conductive material for a via and the trench for the conductive line is then formed to bury the conductive line, and a dual damascene process by which the via hole and the trench are formed and the via hole and the trench for the conductive line are then simultaneously filled with a material for the conductive line.

If the multi-layer conductive line is formed using the dual damascene process, in an unit process constituting the dual damascene process, when a chemical mechanical polishing (CMP) process for forming a lower conductive line and a dual frequency etch process for pre-cleaning a contact portion between the lower conductive line and an upper conductive line are performed, contaminant of the lower conductive line, for example, copper (Cu) contaminant when the lower conductive line is formed using Cu, remains on the surface of the interlayer insulating film and on the side wall within the dual damascene pattern (i.e., including a via hole and a trench). These Cu impurities may degrade the leakage characteristic of the semiconductor device. Thus, in order to manufacture a reliable semiconductor device, an effective process control is necessarily required. Further, as the interlayer insulating films of the semiconductor device are replaced by thin films of a low dielectric constant having a porous property in a dense $SiO_2$ series, a problem such as decrease in the reliability of the semiconductor device due to the Cu impurities becomes further important. Accordingly, in order to solve the above problems, a cleaning process and a process of forming an anti-diffuse film have been brought out as an important issue in the process of manufacturing the multi-layer conductive line.

SUMMARY OF THE INVENTION

The present invention is contrived to solve the above problems and an object of the present invention is to improve the reliability of a semiconductor device by preventing contamination problem due to Cu impurities and the conductive line to conductive line leakage due to re-deposition of Cu within the dual damascene pattern.

Another object of the present invention is to prevent increase in a RC delay due to an increased dielectric constant when a multi-layer conductive line is formed.

Still another object of the present invention is to inhibit decrease in the yield of a via hole, by preventing void generating within the via hole when the multi-layer conductive line is formed.

Further another object of the present invention is to improve the yield of the Cu conductive line, by inhibiting decrease in the yield of the via hole and also preventing diffusion of Cu atoms.

Another object of the present invention is to prevent penetration of Cu atoms due to a subsequent annealing process, by preventing re-deposition of the Cu atoms on the inner side wall of the via hole during the conventional argon (Ar) sputtering process.

In order to accomplish the above object, the method of forming the multi-layer conductive line according to the present invention, is characterized in that it comprises the steps of forming a lower conductive line on a semiconductor substrate in which a lower layer is formed, performing a wet cleaning process to remove impurities remaining on the entire structure and etch an exposed portion of the lower conductive line, performing a selective growth process to form a sacrificial barrier layer at the etched portion of the lower conductive line that was etched in the step of performing the wet cleaning process, forming an interlayer insulating film on the entire structure, etching the interlayer insulating film by means of a dual damascene process so that the sacrificial barrier layer is exposed, to form a dual damascene pattern, and depositing an electroplating film to bury the dual damascene pattern and then performing a chemical mechanical polishing process to form an upper conductive line.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
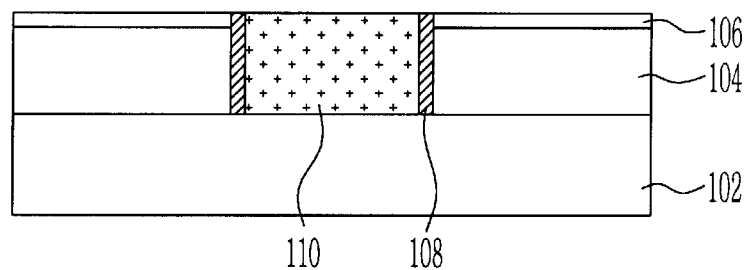
FIG. 1 through FIG. 10 are cross sectional views of semiconductor devices for explaining a method of forming a multi-layer conductive line according to a preferred embodiment of the present invention.

The present invention will be described in detail by way of a preferred embodiment with reference to accompanying drawings, in which like reference numerals are used to identify the same or similar parts.

FIG. 1 through FIG. 10 are cross sectional views of semiconductor devices for explaining a method of forming a multi-layer conductive line according to a preferred embodiment of the present invention.

Referring now to FIG. 1, an insulating film (hereinafter called 'first interlayer insulating film') 104 as an insulating film of a low dielectric constant is deposited on a semiconductor substrate 102 in which a given lower layer (not shown) is formed, using carbon, fluorine-containing low-dielectric silicon oxide, or the like. For example, the lower layer may be any one of a line layer, an insulating layer and a barrier layer, or have a stack structure of at least two or more of them.

Next, a hard mask (hereinafter called 'first hard mask') 106 is formed on the first interlayer insulating film 104 using a dense thin film so that the first interlayer insulating film 104 is not exposed. At this time, considering the adhesive force with a subsequent second interlayer insulating film 114 (see FIG. 5) and in order to prevent degradation of the first interlayer insulating film 104 of the low dielectric constant due to a subsequent $H_2$ plasma treatment (see FIG. 3), the first hard mask 106 is formed using a thin film having a passivation capability against $H_2$.

Thereafter, a photoresist is covered on the entire structure. A photoresist pattern (not shown) is then formed by means of an exposure process and a development process using a photo mask. Next, the first interlayer insulating film 104 is etched by means of an etch process using the photoresist pattern as a mask, thus forming a contact hole (not shown) though which the lower layer is exposed, or a damascene pattern formed by one of the dual damascene process and the single damascene process. The photoresist pattern is then removed by means of a strip process.

Then, a barrier layer 108 (hereinafter called, 'first barrier layer') having a function to prevent diffusion of Cu is formed on the entire structure including an inner surface (i.e., including an inner side and a lower side) of the contact hole. At this time, the first barrier layer 108 may be formed using any one of Ta, TaN, TaAlN, TaSiN, $TaSi_2$, Ti, TiN, TiSiN, WN, Co and $CoSi_2$.

Next, a seed layer (not shown) (hereinafter called, 'first seed layer') is deposited on the first barrier layer 108. At this time, the first seed layer may be formed using any one of Cu, Pt (platinum), Pd (palladium), Ru (rubidium), St (strontium), Rh (rhadium) and Co (cobalt).

Thereafter, an electroplating (EP) process or a chemical vapor deposition (CVD) process is performed for the entire structure so that the contact hole, thus forming a copper electroplating film (hereinafter called 'first electroplating film') (not shown).

Then, a thermal treatment process such as an annealing process is performed for the first electroplating film to crystallize the first electroplating film. The first barrier layer 108 formed on the first hard mask 106 and the first electroplating film are removed by means of a chemical mechanical polishing (CMP) process, thus forming a lower conductive line 110.

Figure 2:
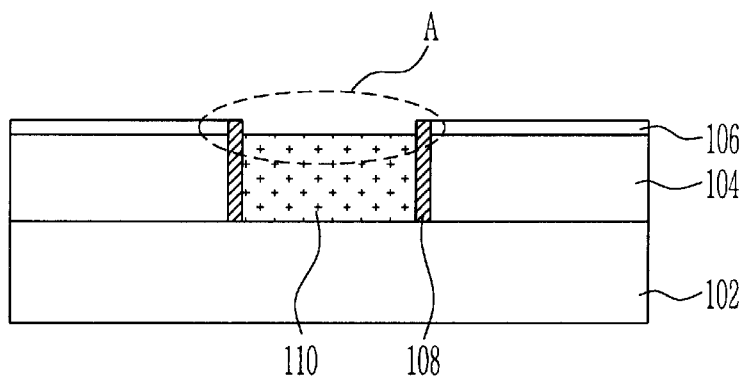
Figure 11:
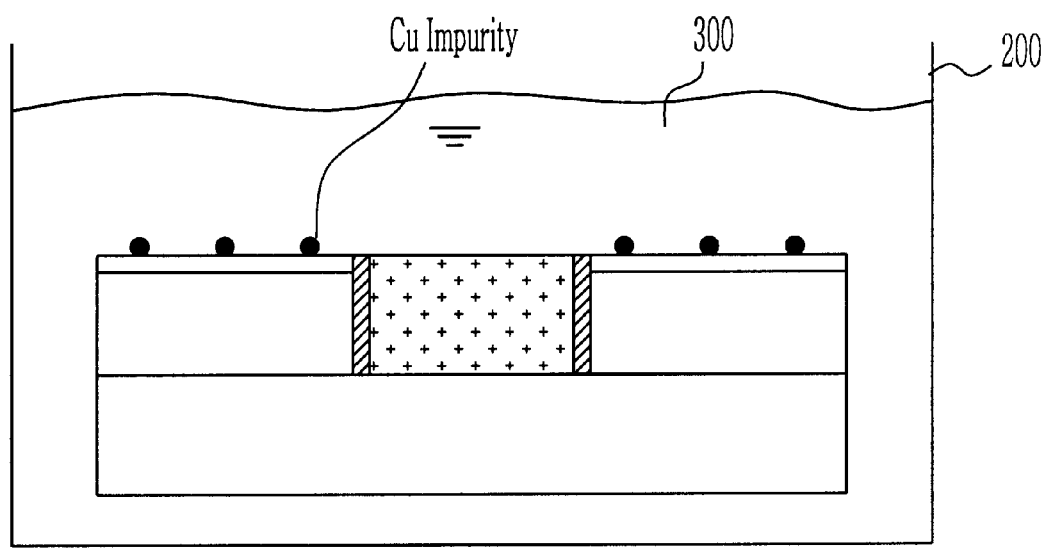
FIG. 11 shows a method of performing a wet cleaning process according to a preferred embodiment of the present invention.

Referring to FIG. 2, in order to remove Cu impurities (see FIG. 11) remaining on the upper surface of the first hard mask 106 and etch the lower conductive line 110 by a given thickness, a wet cleaning process as in FIG. 11 is performed.

As shown in FIG. 11, the wet cleaning process is performed by dipping the wafer (that is, the semiconductor substrate in which the lower conductive line is formed) into a cleaning container 200 into which a nitric acid etch solution 300 is filled. At this time, as the nitric acid etch solution 300, a solution in which $HNO_3$, HF and $H_2O$ are mixed at the ratio of 2:1:10, a solution in which HF and $H_2O$ are mixed at the ratio of 1:10 and a solution in which $HNO_3$ and $H_2O$ are mixed at the ratio of 1:5 are sequentially used. At this time, the wet cleaning process may be performed by dipping the wafer into the cleaning container 200 containing a solution in which $HNO_3$, HF and $H_2O$ are mixed at the ratio of 2:1:10, or firstly dipping the wafer into the cleaning container 200 containing a solution in which HF and $H_2O$ are mixed at the ratio of 1:10 and secondly dipping the wafer into the cleaning container 200 containing a solution in which $HNO_3$ and $H_2O$ are mixed at the ratio of 1:5.

Through the wet cleaning process, a portion of the upper portion of the lower conductive line 110 is etched/removed by a given thickness, as indicated by 'A'. At this time, it is preferred that the cleaning process is performed to etch the upper portion of the lower conductive line 110 by a thickness of about 50 through 100 Å.

Figure 3:
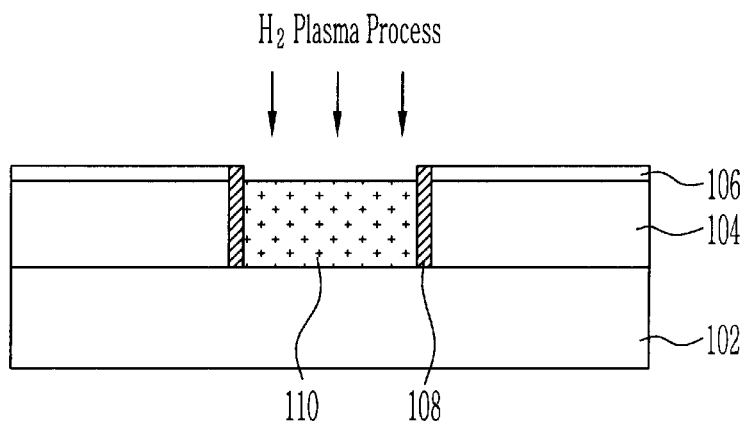

Referring to FIG. 3, in order to remove a copper oxide (CuO) film remaining on the upper surface of the lower conductive line 110 by the exposure and remove unnecessary materials, etc. such as contaminant and particles remaining on the entire structure, a pre-cleaning process using $H_2$ plasma is performed.

Figure 4:
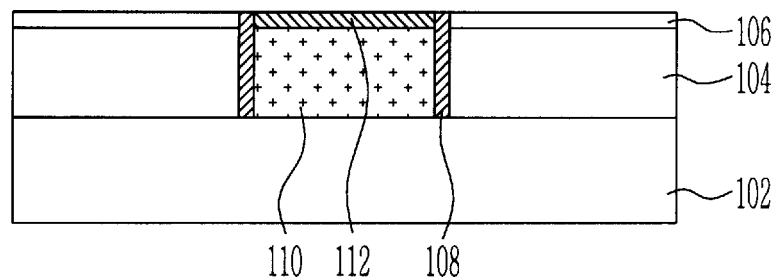

By reference to FIG. 4, a sacrificial barrier layer 112 is formed on the lower conductive line 110 in-situ within the chamber in which the pre-cleaning process is performed.

The sacrificial barrier layer 112 is formed at a portion from which the portion of the lower conductive line 110 is etched by the cleaning process in FIG. 2. For this, before the sacrificial barrier layer 112 is deposited, the upper surface of the lower conductive line 110 is experienced by a surface treatment process using $H_2$ or $SiH_4$ gas at a temperature of 250 through 400° C. so that the lower conductive line 110 is activated. Accordingly, as activation of the lower conductive line 110 rather than the first hard mask 106 is accelerated, the sacrificial barrier layer 112 can be formed only at the lower conductive line 110 in a subsequent selective growth process.

Meanwhile, the sacrificial barrier layer 112 is in-situ experienced by the selective growth process using the chemical vapor deposition (CVD) within the chamber in which the surface treatment process is performed, after the surface treatment process is performed. In general, a method of reliably forming the selective barrier layer in the semiconductor process, is possible if it uses a barrier of tungsten (W) series by means of the CVD process. Therefore, tungsten (W) is grown on the lower conductive line 110 to form the sacrificial barrier layer 112. In addition to tungsten, as all the metal materials for which the selective growth process can be performed can be used, barriers of various types are possible.

Figure 5:
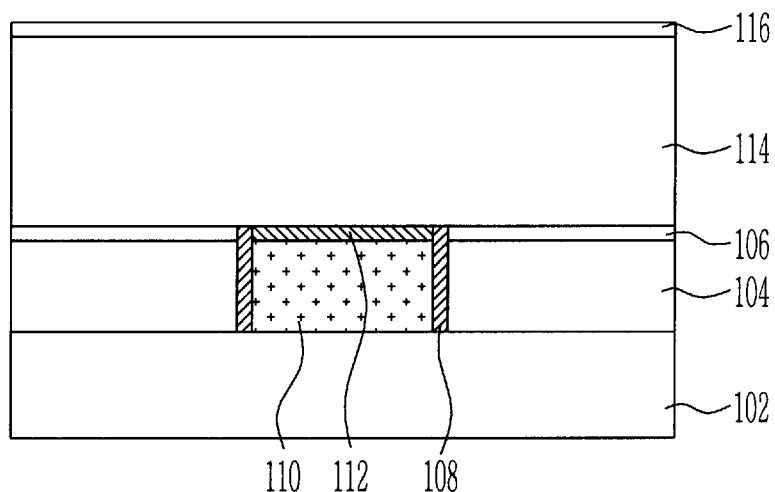

Referring now to FIG. 5, an insulating film (hereinafter called 'second interlayer insulating film') 114 as an insulating film of a low dielectric constant is deposited on the entire structure, using for example silicon oxide, fluorine-containing silicon oxide, fluorine-containing oxide, or the like. Generally, carbon or fluorine-containing silicon oxide has a lower dielectric constant than silicon oxide. The dielectric constant of carbon or fluorine-containing silicon oxide can be controlled by adjusting the amount of carbon or fluorine. At this time, as the A portion shown in FIG. 2 is isolated by the sacrificial barrier layer 112, an insulating film (for example, a dielectric barrier) for preventing diffusion of Cu is not required when a subsequent insulating film is deposited. Thus, as the insulating film inserted in the conventional process is not necessary, the total dielectric constant can be reduced.

Meanwhile, it is most preferred that the second interlayer insulating film 114 is formed using a single insulating film of a low dielectric constant considering the total dielectric constant, as shown in FIG. 5. However, considering a subsequent dual damascene process, the second interlayer insulating film 114 includes a lower insulating film of a low dielectric constant defining a subsequent via hole (see 118 in FIG. 6), an upper insulating film of a low dielectric constant defining a subsequent trench (see 120 in FIG. 6), and an etch stop layer for forming the trench between the lower insulating film of a low dielectric constant and the upper insulating film of a low dielectric constant.

Next, a hard mask (hereinafter called 'second hard mask') 116 is formed on the second interlayer insulating film 114 using a dense thin film so that the second interlayer insulating film 114 is not exposed. At this time, the second hard mask 116 may be formed using the same material such as one used in the first hard mask 106.

Figure 6:
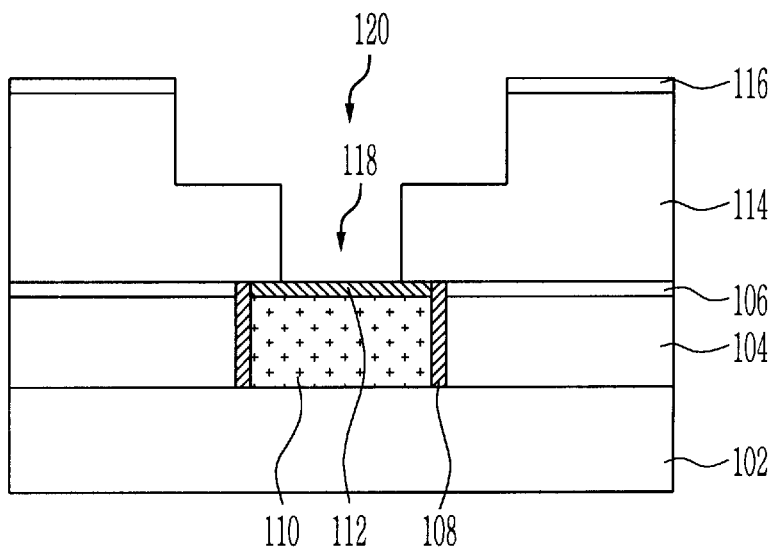

Referring to FIG. 6, the second hard mask 116 and the second interlayer insulating film 114 are etched by the dual damascene process. The via hole 118 and the trench 120 are then formed by means of the dual damascene pattern. At this time, in the dual damascene process, both a pre-via mode by which the via hole 118 is first formed and the trench 120 is then formed, and a post-via mode by which the trench 120 is first formed and the via hole 118 is then formed, can be used. Generally, it is preferred that the dual damascene process is performed in the pre-via mode rather than the post-via mode, in order to obtain a secure interface with the lower conductive line 110.

Figure 7:
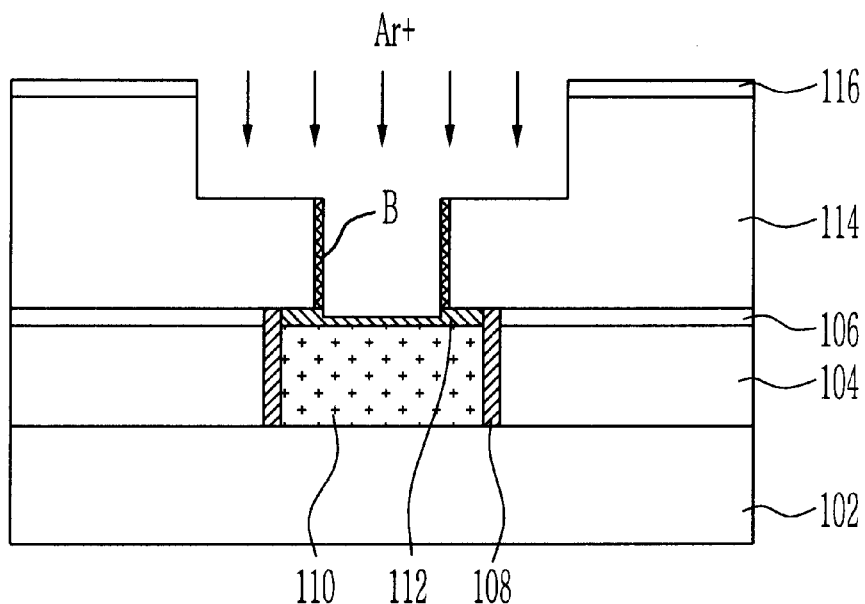

By reference to FIG. 7, in order to reduce a contact resistance, a sputtering process using argon ($Ar^+$) is performed for the sacrificial barrier layer 112 that may be oxidized during the etch process or oxidized in the air. A portion of the sacrificial barrier layer 112 is etched by the Ar sputtering process. A material of the portion of the sacrificial barrier layer 112 thus etched is re-deposited on the inner sidewall ('B' portion) of the via hole 118 to serve as a passivation film of the via hole 118. Through this method, not only degradation in the device caused by Cu deposition on the sidewall of the via hole that was generated conventionally can be prevented but also the thickness of the sacrificial barrier layer 112 can be controlled to have a target thickness. Due to this, it is possible to minimize degradation of the insulating film and increment of the resistance value at the contact region.

Figure 8:
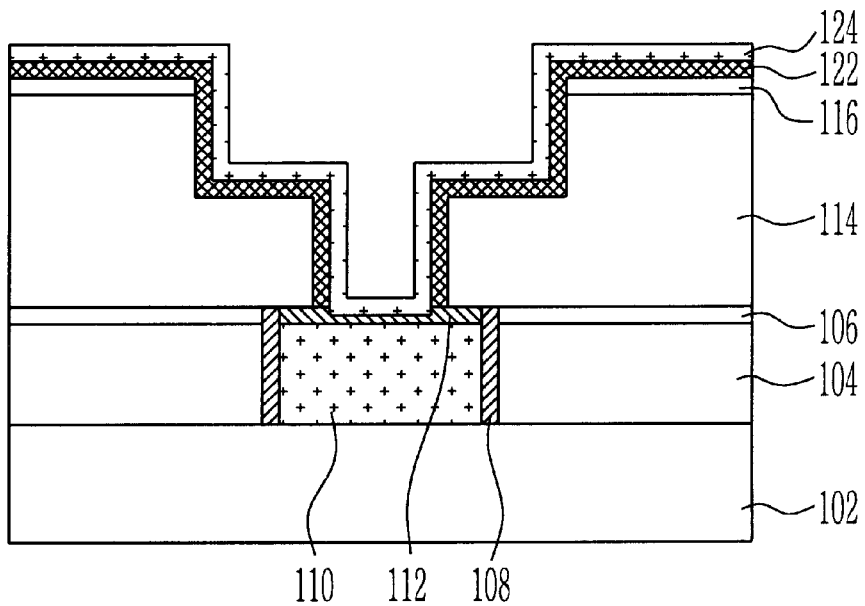

Referring now to FIG. 8, a barrier layer 122 (hereinafter called 'second barrier layer') having a function to prevent diffusion of Cu is formed on the entire structure including an inner surface (i.e., including an inner side and a lower side) of the via hole 118 and the trench 120. At this time, the second barrier layer 122 may be formed using any one of Ta, TaN, TaAlN, TaSiN, $TaSi_2$, Ti, TiN, TiSiN, WN, Co and $CoSi_2$.

Next, a seed layer 124 (hereinafter called 'second seed layer') is deposited on the second barrier layer 122. At this time, the second seed layer 124 may be formed using any one of Cu, Pt (platinum), Pd (palladium), Ru (rubidium), St (strontium), Rh (rhadium) and Co (cobalt).

Figure 9:
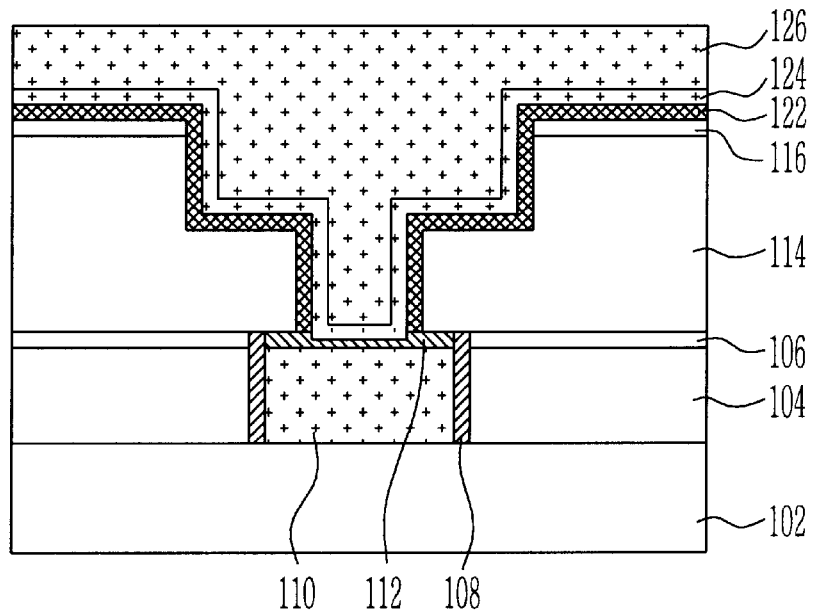

By reference to FIG. 9, the electroplating process is performed for the entire structure so that the via hole 118 and the trench 120 are buried, thus forming a copper electroplating film (hereinafter called 'second electroplating film') 126. The second electroplating film 126 is then crystallized by a thermal treatment process such as an annealing process.

Figure 10:
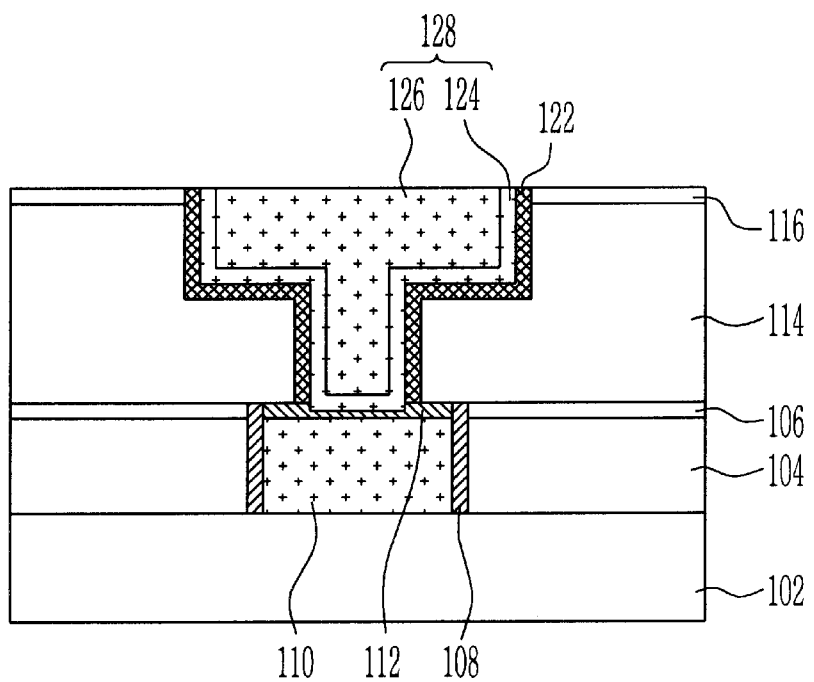

Referring to FIG. 10, the second electroplating film 126 is experienced by the CMP process to sequentially remove the second electroplating film 126, the second seed layer 124 and the second barrier layer 122 that are deposited on the second interlayer insulating film 114, thus forming an upper conductive line 128.

As mentioned above, according to the present invention, before the upper conductive line is formed, the sacrificial barrier layer is formed on the lower conductive line to reduce the insulating film used as a conventional dielectric barrier. Therefore, the present invention has an advantageous effect that it can reduce the total dielectric constant of the insulating materials. Also, during the pre-cleaning, a self-aligned barrier is formed at the contact region. The present invention can prevent lateral diffusion on the contact.

Further, in the present invention, etching of the lower conductive line due to mis-alignment of the via hole is prevented in advance by forming the sacrificial barrier layer. Thus, the present invention has an outstand effect that it can prevent degradation in the insulating characteristic of the interlayer insulating film occurring as a material of the lower conductive line is redeposited on the interlayer insulating film due to etching of the lower conductive line.

Also, in the present invention, before the sacrificial barrier layer is formed, Cu impurities remaining on the upper surface of the lower conductive line and on the upper surface of the first interlayer insulating film are removed by performing the cleaning process for the lower conductive line. Therefore, the present invention has an outstanding advantage that it can reduce the leakage current generating between the upper and lower conductive lines.

In addition, according to the present invention, a portion of the upper portion of the lower conductive line is etched by a given thickness and a selective growth process is then performed to selectively form the sacrificial barrier layer at the etched portion of the lower conductive line. Therefore, the present invention has an advantageous effect that it can obviate additional photolithography and etch processes.

Further, in the present invention, before the sacrificial barrier layer is formed, a $H_2$ plasma process is performed for the lower conductive line. Thus, the present invention can improve an interfacial characteristic between the lower conductive line and the sacrificial barrier layer.

Also, in the present invention, after the dual damascene process, the sacrificial barrier layer is etched by means of an argon sputtering process to make thin the thickness of the sacrificial barrier layer. Therefore, the present invention can reduce the total dielectric constant.

Incidentally, according to the present invention, the sacrificial barrier layer is etched and a material constituting the etched sacrificial barrier layer is simultaneously re-deposited on the inner sidewall of the via hole, by means of the argon sputtering process. Therefore, the present invention has an advantageous effect that it can improve the step coverage of the barrier layer within the via hole.

Also, the present invention has an advantageous effect that it can improve a gap fill capability of the electroplating film upon the deposition process using electroplating due to improved step coverage within the via hole.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a multi-layer conductive line, comprising the steps of:

(a) forming a lower conductive line on a semiconductor substrate in which a lower layer is formed;

(b) performing a wet cleaning process to remove impurities remaining on the entire structure and etch an exposed portion of the lower conductive line;

(c) performing a selective growth process to form a sacrificial barrier layer at the etched portion of the lower conductive line that was etched in the step (b);

(d) forming an interlayer insulating film on the entire structure;

(e) etching the interlayer insulating film by means of a dual damascene process so that the sacrificial barrier layer is exposed, to form a dual damascene pattern; and (f) depositing an electroplating film to bury the dual damascene pattern and then performing a chemical mechanical polishing process to form an upper conductive line.

2. The method as claimed in claim 1, further comprising the step of before the step (c), performing a surface treatment process for an upper portion of the lower conductive line in order to activate the lower conductive line in which the sacrificial barrier layer is formed.

3. The method as claimed in claim 2, wherein the surface treatment process is performed using $H_2$ or $SiH_4$ gas at a temperature of 250 through 400° C.

4. The method as claimed in claim 2, wherein the surface treatment and selective growth processes are in-situ performed within the same chamber.

5. The method as claimed in claim 1, wherein the selective growth process is performed using a chemical vapor deposition.

6. The method as claimed in claim 1, wherein the sacrificial barrier layer is formed using tungsten.

7. The method as claimed in claim 1, further comprising the step of after the step (e), performing an argon sputtering process for the sacrificial barrier layer so that a portion of the sacrificial barrier layer is etched and a material of the etched sacrificial barrier layer is then re-deposited on an inner side wall of the dual damascene pattern.

8. The method as claimed in claim 1, wherein the lower conductive line and the upper conductive line are copper conductive lines.

* * * * *